(12) United States Patent
Nguyen et al.

(10) Patent No.: US 7,123,496 B2
(45) Date of Patent: Oct. 17, 2006

(54) L0 CACHE ALIGNMENT CIRCUIT

(75) Inventors: Jeffrey T. Nguyen, Portland, OR (US); Daniel Chow, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 88 days.

(21) Appl. No.: 10/841,447

(22) Filed: May 10, 2004

(65) Prior Publication Data

US 2005/0259476 A1    Nov. 24, 2005

(51) Int. Cl.
*G11C 15/00* (2006.01)

(52) U.S. Cl. ............... 365/49; 365/185.13; 365/230.01

(58) Field of Classification Search .................. 365/49, 365/185.13, 230.01
See application file for complete search history.

(56) References Cited

U.S. PATENT DOCUMENTS

| | | | |
|---|---|---|---|
| 4,561,072 A * | 12/1985 | Arakawa et al. ....... | 365/189.04 |
| 6,199,154 B1 | 3/2001 | Witt .......................... | 712/205 |
| 6,237,064 B1 | 5/2001 | Kumar et al. ............... | 711/122 |
| 6,247,094 B1 | 6/2001 | Kumar et al. .................. | 711/3 |
| 6,272,597 B1 | 8/2001 | Fu et al. ...................... | 711/131 |
| 6,442,089 B1 * | 8/2002 | Fletcher et al. ............. | 365/207 |
| 6,629,271 B1 | 9/2003 | Lee et al. ...................... | 714/49 |
| 6,661,253 B1 | 12/2003 | Lee et al. ...................... | 326/41 |
| 6,987,704 B1 * | 1/2006 | Park ........................... | 365/233 |
| 2003/0056080 A1 * | 3/2003 | Watanabe ................... | 711/219 |
| 2005/0036389 A1 * | 2/2005 | Kim ...................... | 365/230.03 |

* cited by examiner

*Primary Examiner*—Richard Elms
*Assistant Examiner*—Pho M. Luu
(74) *Attorney, Agent, or Firm*—Fleshner & Kim, LLP

(57) ABSTRACT

A L0 cache is provided that includes a plurality of memory cells, full swing signal bit lines coupled to the plurality of memory cells to output full swing data signals, small signal global bit lines coupled to the full swing signal bit lines to provide small signal data signals, and an alignment device to align signals on the small signal global bit lines.

27 Claims, 5 Drawing Sheets

L0 CACHE ALIGNMENT CIRCUIT

FIELD

Embodiments of the present invention may relate to circuit design. More particularly, embodiments of the present invention may relate to L0 caches.

BACKGROUND

Computer systems may employ a multi-level hierarchy of memory. A relatively fast, expensive but limited-capacity memory may be provided at a highest level of the hierarchy and a relatively slower, lower cost (but higher-capacity) memory may be provided at the lowest level of the hierarchy. The hierarchy may include a small fast memory called a cache, either physically integrated within a processor or mounted physically close to the processor for speed. The computer system may employ separate instruction caches and data caches.

When executing an instruction that requires access to memory (e.g., read from memory or write to memory), a processor may access a cache in an attempt to satisfy the instruction. Of course, the cache may be implemented in a manner that allows the processor to access the cache in an efficient manner. That is, the cache may be implemented in a manner such that the processor is capable of accessing the cache (i.e., reading from the cache or writing to the cache) quickly so that the processor may execute instructions quickly. Caches have been configured in both on-chip and off-chip arrangements. On-chip caches have less latency, since they may be closer to the processor. However, since on-chip area is expensive, on-chip caches are typically smaller than off-chip caches. Off-chip caches may have longer latencies since they may be remotely located from the processor. However, such caches may be larger than on-chip caches.

Some systems have multiple caches, some small and some large. The smaller caches may be located on-chip, and the larger caches may be located off-chip. Typically, in multi-level cache designs, a first level of cache (i.e., an L0 cache) may be accessed first to determine whether a true cache hit for a memory access request is achieved. If a true cache hit is not achieved for the first level of cache, then a determination may be made for the second level of cache (i.e., an L1 cache), and so on, until the memory access request is satisfied by one of the levels of cache. If the requested address is not found in any of the cache levels, the processor may send a request to the system's main memory in an attempt to satisfy the request.

BRIEF DESCRIPTION OF THE DRAWINGS

The foregoing and a better understanding of the present invention may become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

The following represents brief descriptions of the drawings in which like reference numerals represent like elements and wherein.

DETAILED DESCRIPTION

Figure 1:
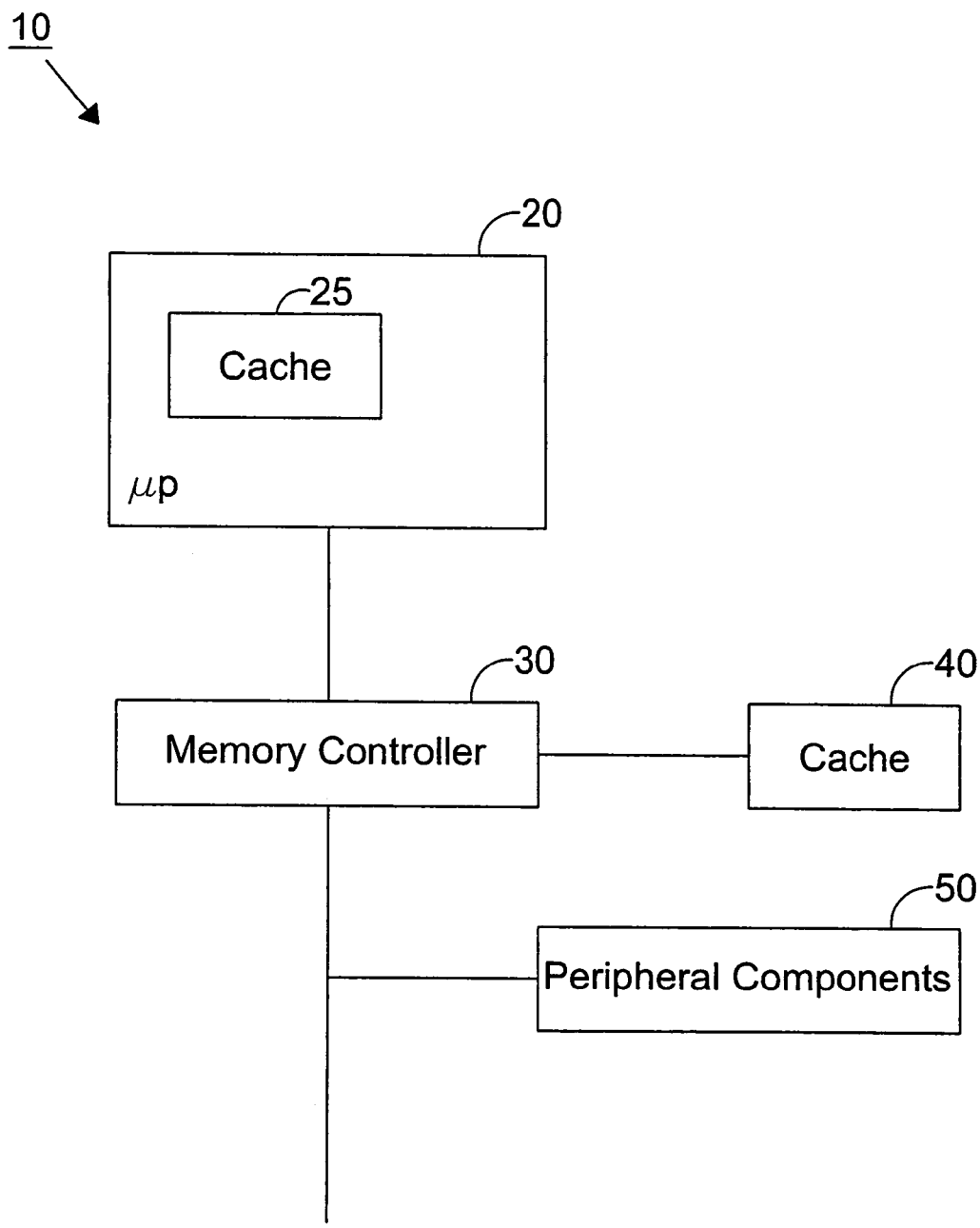
FIG. 1 is a block diagram of a computer system according to an example arrangement.

In the following detailed description, like reference numerals and characters may be used to designate identical, corresponding or similar components in differing figure drawings. Further, in the detailed description to follow, example sizes/models/values/ranges may be given although embodiments of the present invention are not limited to the same. Well-known power/ground connections to integrated circuits (ICs) and other components may not be shown within the FIGS. for simplicity of illustration and discussion. Further, arrangements and embodiments may be shown in block diagram form in order to avoid obscuring the invention, and also in view of the fact that specifics with respect to implementation of such block diagram arrangements may be dependent upon the platform within which the present invention is to be implemented. That is, the specifics may be well within the purview of one skilled in the art. Where specific details are set forth in order to describe example embodiments of the invention, it should be apparent to one skilled in the art that embodiments of the present invention can be practiced without these specific details.

Embodiments of the present invention may provide an L0 data cache that includes a plurality of memory cells, large signal bit lines coupled to the plurality of memory cells and an alignment device to align signals on small signal global bit lines coupled to the large signal bit lines. The alignment device may be provided on-chip (within the L0 data cache) and may perform alignment, rotation and/or rotation of the signals received from the respective memory cells on the bit lines. The alignment device may be incorporated (or integrated) into the cache device and utilize small signals. This type of topology may reduce the number of logic states and enable speed improvement in L0 load accesses. Speed may be increased over disadvantageous arrangements that utilize two clock signals for use of cache alignment. This type of L0 cache may be a hybrid type of cache in which write operations may be performed using full rail voltages (or digital signals) and read operations may be performed using small signal voltages (or analog signals).

As used in this disclosure, small signals may be signals that do not reach a value of "1" (VCC) and a value of "0" during evaluation. Rather, as one example, small signals may correspond to analog signals between "1" and "0" (such as digital values). Embodiments of the present invention may also utilize local bit lines and global bit lines. These bit lines may correspond to signal lines that carry data from the memory cells of the data cache. As one example, local bit lines may be one segment of the circuit that couples to the memory cells' pass gate transistor. Global bit lines may be another segment of the circuit that couples the local bit line to the output. As used in at least one example embodiment, local bit lines and global bit lines may correspond with a 32-to-1 multiplexer structure that is implemented in two stages (i.e., an 8-to-1 multiplexer in the first segment followed by a 4-to-1 multiplexer in the second segment).

FIG. 1 is a block diagram of a computer system according to an example arrangement. Other arrangements and configurations are also possible. More specifically, FIG. 1 shows a computer system 10 that includes a microprocessor 20, a memory controller 30, a system memory 40 and peripheral components 50. The microprocessor 20 includes an L0 cache 25 that may be part of a memory hierarchy to store data, where the system memory 40 may be part of the memory hierarchy. Communication between the microprocessor 20 and the system memory 40 may be facilitated by the memory controller (or chipset) 30, which may also facilitate in communicating with the peripheral components 50.

Figure 2:
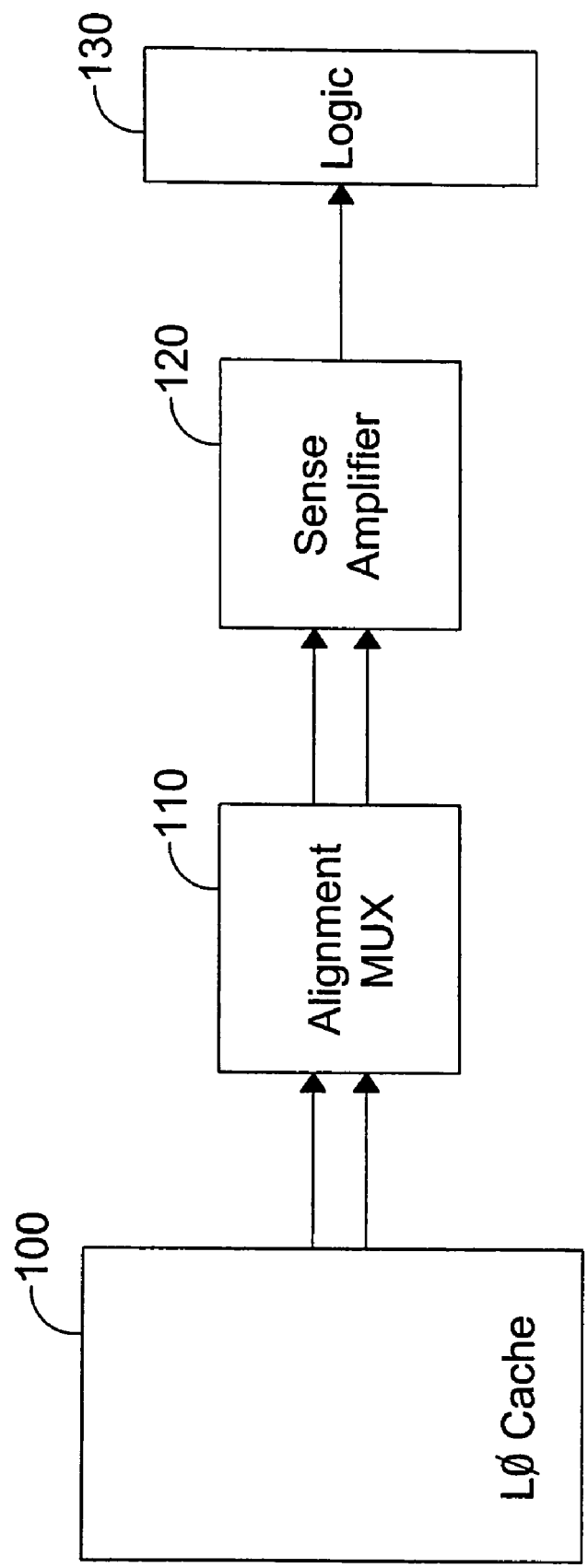
FIG. 2 is a block diagram of an L0 cache, alignment multiplexer and sense amplifier according to an example arrangement.

FIG. 2 is a block diagram of an L0 cache, alignment multiplexer and sense amplifier according to an example arrangement. Other arrangements are also possible. These components may be provided on-chip, such as within the microprocessor 20 shown in FIG. 1. More specifically, FIG. 2 shows an L0 cache 100 that may provide signals to an alignment multiplexer 110 located outside the L0 cache 100. The alignment multiplexer 110 performs various functions including alignment and rotation of signals. For example, the alignment multiplexer 110 may perform formatting of the signals. The alignment multiplexer 110 provides aligned and rotated signals to the sense amplifier 120. The sense amplifier 120 senses small signals (or small swing signals) from the alignment multiplexer section 110 and outputs a full rail signal to digital logic 130. The digital logic 130 may include various state machines. Accordingly, the L0 cache 100 and the alignment multiplexer 110 output small signals and the sense amplifier 120 converts the small signals into full rail digital signals. The logic 130 performs appropriate digital operations based on the digital output signals of the sense amplifier 120.

Though not specifically shown in FIG. 2, the L0 cache 100 outputs numerous small signals to a plurality of alignment multiplexers, each similar in operation to the alignment multiplexer 110. Each of the plurality of alignment multiplexers may output small signals along different signal lines to a plurality of sense amplifiers, each similar in operation to the sense amplifier 120. Each of the plurality of sense amplifiers may output digital signals to corresponding digital logic.

Figure 3:
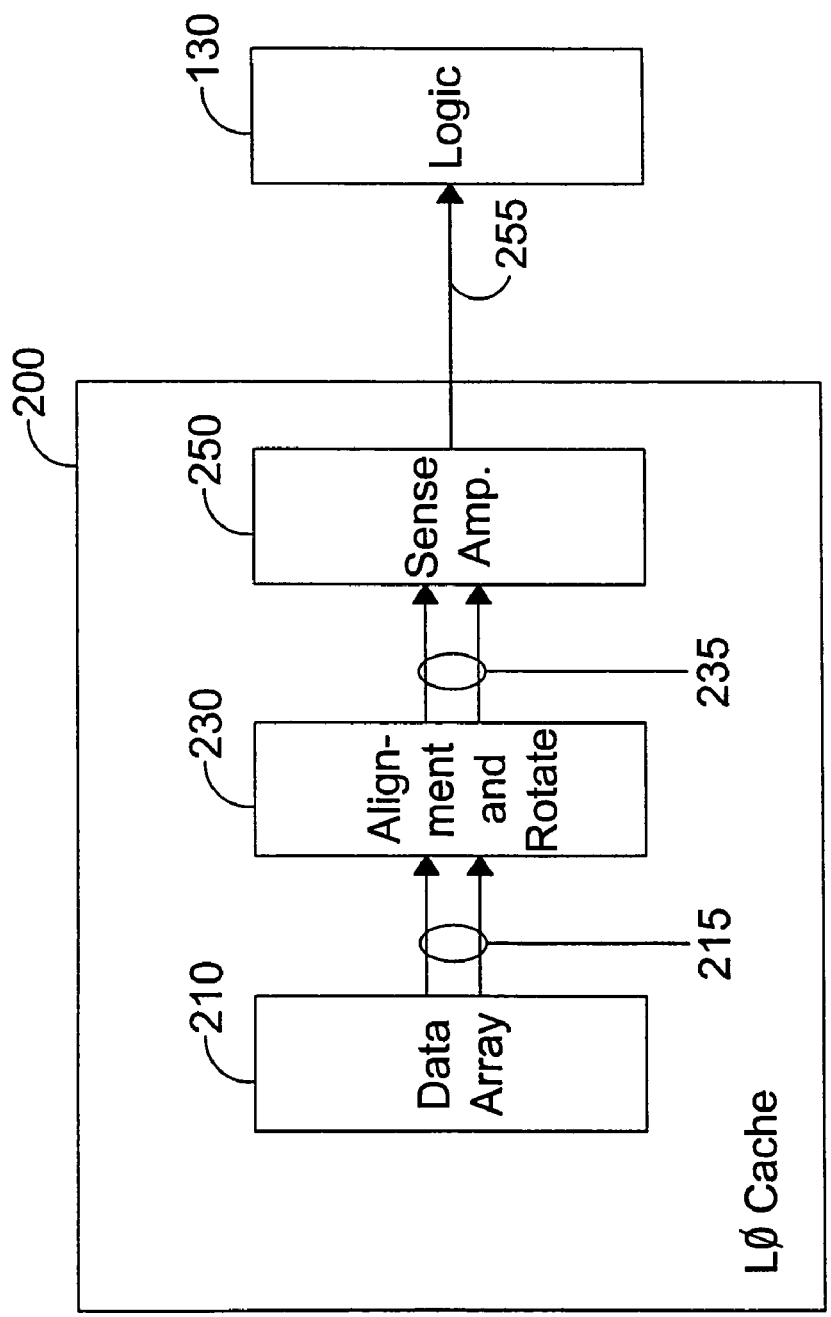
FIG. 3 is a block diagram of an L0 cache according to an example embodiment of the present invention.

FIG. 3 is a block diagram of an L0 cache according to an example embodiment of the present invention. Other embodiments and configurations are also within the scope of the present invention. These components may be provided on-chip, such as within the microprocessor 20 shown in FIG. 1. More specifically, the L0 cache 200 includes a data array 210, an alignment and rotate section 230 and a sense amplifier section 250. In this embodiment, the L0 cache 200 outputs digital signals along respective signal lines to the logic 130. In other words, the L0 cache 200 outputs digital logic signals to the digital logic 130.

The data array 210 may include a plurality of memory cells that may be appropriately read from and written to. Following an appropriate read signal, such as a full swing local bit line signal, the data array 210 may output small signals on signal lines 215 to the alignment and rotate section 230. The signal lines 215 may correspond to local bit lines, for example. The alignment and rotate section 230 may perform various functions including alignment and rotation of signals while within the cache. This may be accomplished by the incorporation (and/or integration) of the alignment and rotate section 230 within the cache 200.

The functionality of an alignment multiplexer may be provided along global bit lines (using small signals). For example, the alignment and rotate section 230 may perform formatting of the signals and provide aligned and rotated signals to the sense amplifier section 250 via signal lines 235. The signal lines 235 may correspond to global bit lines, for example. The sense amplifier section 250 may include a plurality of sense amplifiers to sense small signals received from the signal lines 235 and output full rail signals (i.e. digital signals) along signal lines to the appropriate logic 130. For ease of illustration, only one signal line 255 is shown in FIG. 3 coupling the cache 200 to the logic 130. Embodiments of the present invention may include a plurality of signal lines coupling the cache 200 and the logic 130 such that an output of each sense amplifier within the sense amplifier section 250 travels across a signal line to the digital logic 130.

In FIG. 3, the signal lines 215 may be small signal local bit lines and the signal lines 235 may be small signal global bit lines. Other types of bit lines and signal lines are also within the scope of the present invention. For example, one memory cell within the array 210 may output signals along a small signal bit line. Although not specifically shown within FIG. 3, signals may be output from other memory cells on other signal lines. The small signal local bit line may provide small signals to the alignment and rotate section 230. The alignment and rotate section 230 outputs the appropriately aligned and rotated signals along small signal global bit lines to a corresponding sense amplifier within the sense amplifier section 250. Although not shown in FIG. 3, each sense amplifier may receive an output signal and its corresponding compliment output signal from the L0 cache. In other words, all the components shown in FIG. 3 may be provided within the L0 cache 200.

Figure 4:
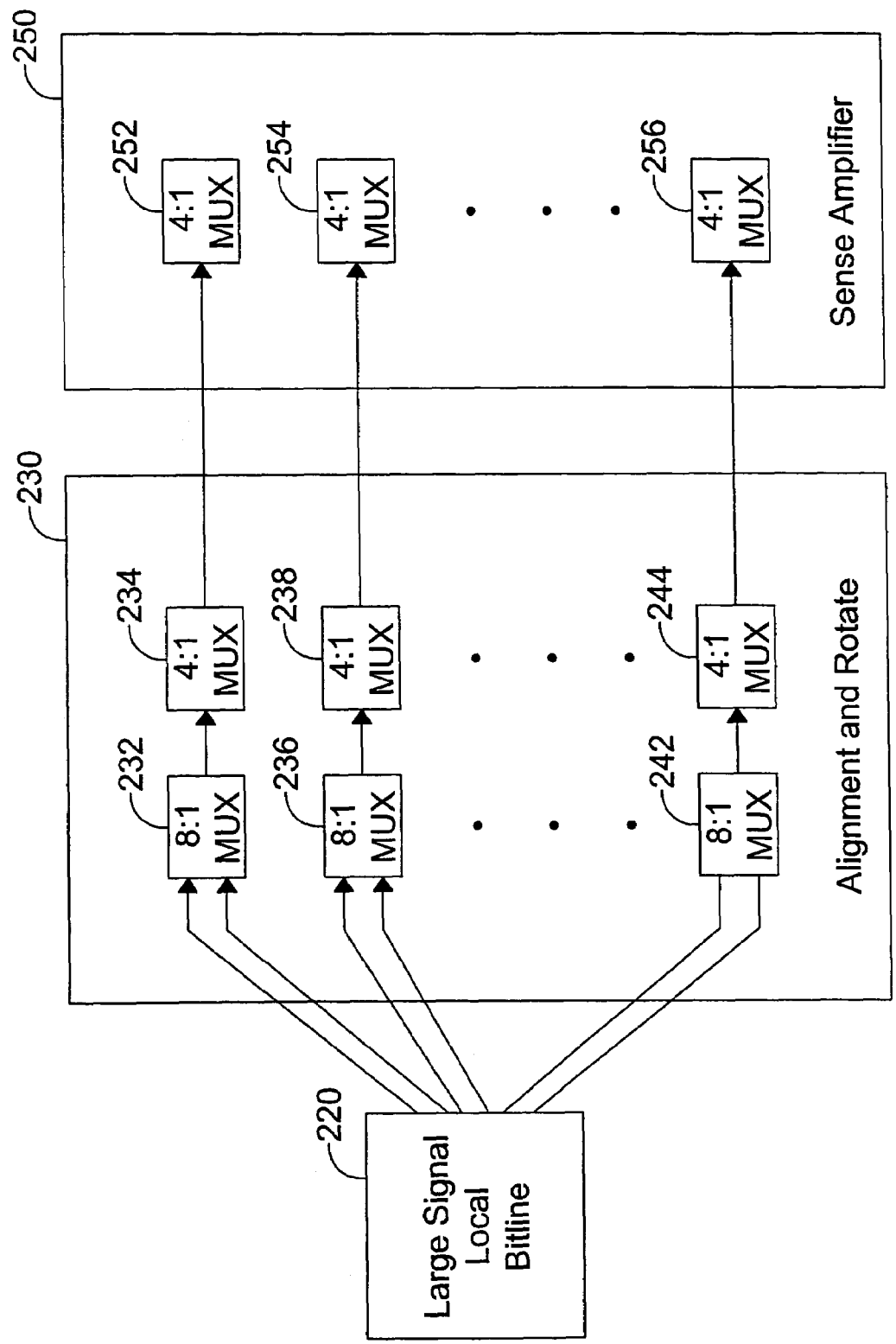
FIG. 4 is a block diagram of an L0 cache according to an example embodiment of the present invention.

FIG. 4 is a block diagram of an L0 cache according to an example embodiment of the present invention. Other embodiments and configurations are also within the scope of the present invention. These components may be provided on-chip, such as within the microprocessor 20 shown in FIG. 1. More specifically, FIG. 4 shows large signal local bit lines 220, a multi-level alignment and rotate section 230 and a multi-level sense amplifier section 250. Each level within the alignment and rotate section 230 corresponds with one of the levels of the sense amplifier section 250. Not all levels of the multi-level alignment and rotate section 230 and the multi-level sense amplifier section 250 are shown in FIG. 4 for ease of illustration.

Each level of the alignment and rotate section 230 may correspond to a 32-to-1 multiplexer to perform the various alignment and rotation of the respective signals from the large signal local bit lines 220. For example, one of the parallel levels may include an 8-to-1 multiplexer 232 coupled to a 4-to-1 multiplexer 234 so as to function as a 32-to-1 multiplexer. Another one of the parallel levels may include an 8-to-1 multiplexer 236 coupled to a 4-to-1 multiplexer 238 so as to function as a 32-to-1 multiplexer. Still another one of the parallel levels may include an 8-to-1 multiplexer 242 coupled to a 4-to-1 multiplexer 244 so as to function as a 32-to-1 multiplexer. The level including the 8-to-1 multiplexer 232 and the 4-to-1 multiplexer 234 may output small signals along a global bit line to the sense amplifier section 250 and more specifically to a sense amplifier 252 on the corresponding level. Similarly, the level including the 8-to-1 multiplexer 236 and the 4-to-1 multiplexer 238 may output small signals along a global bit line to a sense amplifier 254 on the corresponding level. Additionally, the level including the 8-to-1 multiplexer 242 and the 4-to-1 multiplexer 244 may output small signals along a global bit line to a sense amplifier 256 on the corresponding level. The sense amplifier section 250 may output corresponding signals from each one of the respective sense amplifiers 252, 254 and 256.

Although not specifically shown in FIG. 4, a corresponding alignment and rotate section may also be provided to receive compliments of the signals output from the large signal local bit lines 220. This system may thereby operate under a dual rail methodology. Each of these compliments may be output to the respective one of the sense amplifiers shown in the sense amplifier section 250.

Figure 5C:
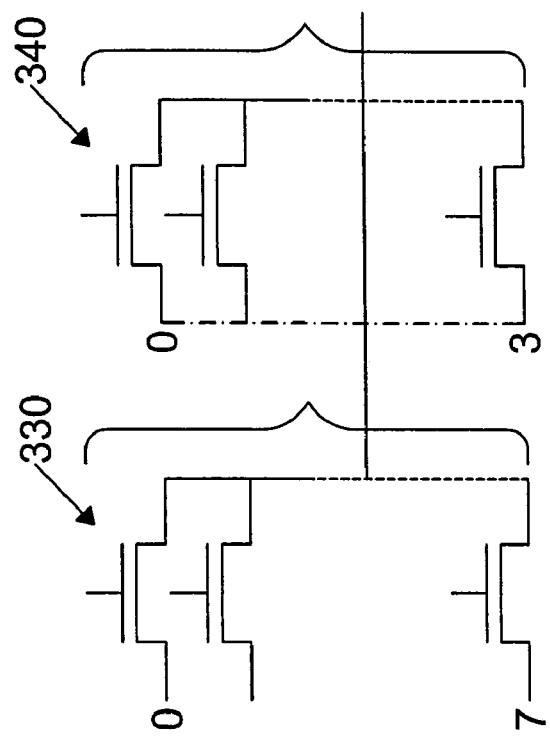
FIGS. 5A–5C show circuit diagrams of a 32-to-1 multiplexer for use in example embodiments of the present invention.
Figure 5B:
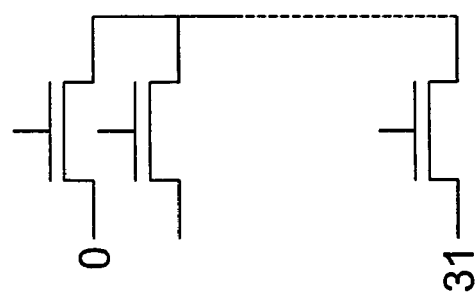
Figure 5A:
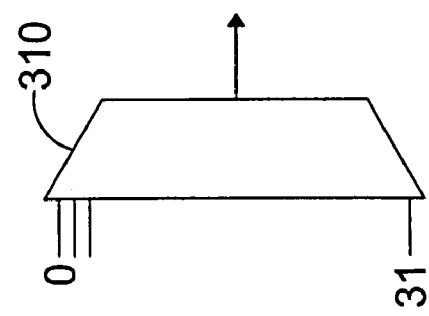

FIGS. 5A–5C show circuit diagrams of a 32-to-1 multiplexer for use in example embodiments of the present invention. Other embodiments, configurations and multiplexers are also within the scope of the present invention. More specifically, FIG. 5A shows a logical diagram of a 32-to-1 multiplexer 310 that may be used in the alignment and rotate section 230. Outputs of the multiplexer 310 may be provided along global bit lines to the sense amplifier section 250. FIG. 5B shows a circuit diagram of the 32-to-1 multiplexer 310. More specifically, FIG. 5B shows a plurality of pass gate transistors used as part of the 32-to-1 multiplexer 310. FIG. 5C shows a circuit diagram of the 32-to-1 multiplexer 310 that includes both an 8-to-1 multiplexer 330 (such as the 8-to-1 multiplexer 232 shown in FIG. 4) and a 4-to-1 multiplexer 340 (such as the 4-to-1 multiplexer 234 shown in FIG. 4). The 8-to-1 multiplexer 330 includes a plurality of pass gate transistors, and the 4-to-1 multiplexer 340 includes another plurality of pass gate transistors. Outputs of the 4-to-1 multiplexer 340 may be provided along global bit lines to the sense amplifier section 250.

Signals output from the respective sense amplifiers of the sense amplifier section 250 may be output from the L0 cache to logic, such as logic 130 shown in FIG. 3.

Accordingly, embodiments of the present invention may include a cache-designed topology that has a built-in alignment function in the global bit lines. This may be accomplished by integrating two stages of N pass gates connected in series (shown as multiplexers 330 and 340 in FIG. 5C) into the global bit lines in a read path. During a load, data may be read out from the memory cell, going through a full swing 8-bit segment local bit line, a small signal global bit line that has two N pass gates in series that perform shift and rotate functions, a sense amplifier and a CMOS driver.

Embodiments of the present invention may provide speed up in the critical path between the L0 cache and an alignment multiplexer as it reduces the total delay pass.

Embodiments of the present invention may be provided within various electronic systems. Examples of represented systems may include computers (e.g., desktops, laptops, handhelds, servers, tablets, web appliances, routers, etc.), wireless communications devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments of the present invention have been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A cache comprising:
   a plurality of memory cells;
   local bit lines coupled to the plurality of memory cells to provide data signals from the memory cells;
   global bit lines coupled to the local bit lines to provide small signal data signals;
   an alignment device to align the small signal data signals on the global bit lines; and
   a sense amplifier coupled to the alignment device to provide a signal based at least on a signal received from the alignment device.

2. The cache of claim 1, wherein the cache comprises a L0 cache.

3. The cache of claim 1, wherein the alignment device to further rotate the small signal data signals on the global bit lines.

4. The cache of claim 1, wherein the alignment device comprises a multiplexer.

5. The cache of claim 4, wherein the multiplexer comprises an 8-to-1 multiplexer and a 4-to-1 multiplexer coupled to the global bit lines.

6. The cache of claim 5, wherein each of the 8-to-1 multiplexer and the 4-to-1 multiplexer comprise a passgate transistor.

7. The cache of claim 1, wherein the alignment device comprises a plurality of parallel levels each coupled to at least one of the global bit lines.

8. The cache of claim 7, further comprising a plurality of sense amplifiers each coupled to one of the plurality of parallel levels of the alignment device.

9. An L0 cache device comprising:
   an alignment/rotation device to perform alignment or rotation of small signals within the L0 cache device; and
   a sense amplifier to receive the small signals from the alignment/rotation device and to amplify the small signals to a full rail voltage prior to being output from the L0 cache device.

10. The L0 cache device of claim 9, further comprising a plurality of memory cells.

11. The L0 cache device of claim 10, further comprising full swing bit lines to provide signals representing data from the memory cells.

12. The L0 cache device of claim 11, further comprising small signal global bit lines to provide the small signal data signals from the alignment/rotation device.

13. The L0 cache device of claim 9, wherein the alignment/rotation device comprises a multiplexer.

14. The L0 cache device of claim 13, wherein the multiplexer comprises an 8-to-1 multiplexer and a 4-to-1 multiplexer coupled to a small signal global bit line.

15. The L0 cache device of claim 14, wherein each of the 8-to-1 multiplexer and the 4-to-1 multiplexer comprise a passgate transistor.

16. The L0 cache device of claim 9, wherein the alignment device comprises a plurality of parallel levels each coupled to at least one small signal global bit line.

17. The L0 cache device of claim 16, further comprising a plurality of sense amplifiers each coupled to one of the plurality of parallel levels.

18. The L0 cache of claim 9, wherein the small signals comprise small swing data signals.

19. The L0 cache of claim 9, wherein the sense amplifier receives the small signals from the alignment/rotation device along global bit lines.

20. An electronic system comprising:
a chip having a processor and a cache; and
a memory provided external to said chip, the cache comprising:
a plurality of memory cells;
full swing bit lines coupled to the plurality of memory cells to output data signals;
small signal global bit lines coupled to the full swing bit lines to provide small signal data signals; and
an alignment device to align the small signal data signals on the small signal global bit lines.

21. The electronic system of claim 20, wherein the cache comprises a L0 cache.

22. The electronic system of claim 20, wherein the alignment device to further rotate the small signal data signals on the small signal global bit lines.

23. The electronic system of claim 20, further comprising a sense amplifier coupled to the alignment device to provide a signal output from the cache based at least on a signal received from the alignment device.

24. The electronic system of claim 20, further comprising a sense amplifier device provided within the cache and coupled to receive small signal data signals from the alignment device and to provide full rail voltage signals to outside the cache.

25. The electronic system of claim 20, wherein the small signal data signals comprise small swing data signals.

26. A cache comprising:
a plurality of memory cells;
local bit lines coupled to the plurality of memory cells to provide data signals from the memory cells;
global bit lines coupled to the local bit lines to provide small signal data signals; and
an alignment device to align the small signal data signals on the global bit lines, wherein the small signal data signals comprise small swing data signals.

27. The cache of claim 26, further comprising a sense amplifier device provided within the cache and coupled to receive the small signal data signals from the alignment device and to provide full rail voltage signals to outside the cache.

* * * * *